United States Patent
Harima et al.

(10) Patent No.: US 6,833,768 B2
(45) Date of Patent: Dec. 21, 2004

(54) SURFACE-MOUNT CRYSTAL OSCILLATOR

(75) Inventors: Hidenori Harima, Saitama (JP);
Hiroaki Mizumura, Saitama (JP);
Kenichi Sugawara, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/383,263

(22) Filed: Mar. 6, 2003

(65) Prior Publication Data

US 2003/0210102 A1 Nov. 13, 2003

(30) Foreign Application Priority Data

Mar. 7, 2002 (JP) .......................... 2002-062213
Apr. 25, 2002 (JP) .......................... 2002-123638

(51) Int. Cl.[7] ................................ H03B 5/32
(52) U.S. Cl. .................... 331/158; 331/68; 257/666; 257/679; 29/841; 438/124
(58) Field of Search ................ 331/158, 68, 108 C, 331/116 R; 257/666, 679; 438/124; 29/841

(56) References Cited

U.S. PATENT DOCUMENTS 5,200,366 A * 4/1993 Yamada et al. ............... 29/841
6,229,404 B1 * 5/2001 Hatanaka ..................... 331/68

* cited by examiner

Primary Examiner—Arnold Kinkead
(74) Attorney, Agent, or Firm—Knobbe Martens Olson & Bear, LLP

(57) ABSTRACT

A surface-mount crystal oscillator includes a crystal unit housing and an element housing which is provided on the base side of the crystal unit housing. A crystal blank is accommodated and hermetically sealed in the crystal unit housing. A concavity having an open side is formed in the element housing, and an IC chip is secured to the bottom surface of the concavity by means of face-down bonding. Notch portions or recess portions which are adjoining and connecting to the concavity and which are used for injecting fluid resin are formed in the frame portion at the periphery of the concavity. Fluid resin is injected to the bottom surface of the concavity by way of the notch portions and cured to form a protective resin layer of the IC chip.

20 Claims, 6 Drawing Sheets

SURFACE-MOUNT CRYSTAL OSCILLATOR

BACKGROUND OF THE INVENTION

1. Field of the Invention

The present invention relates to a surface-mount crystal oscillator, and more particularly to a surface-mount crystal oscillator which is amenable to miniaturization and which enables protection of an integrated circuit (IC) including, for example, an oscillation circuit.

2. Description of the Related Art

Surface-mount crystal oscillators, in which a quartz crystal unit and an oscillation circuit which works together with the crystal unit are accommodated in a surface-mount receptacle, are widely used as reference sources for frequency or time in various portable devices due to their light weight and small size. Surface-mount crystal oscillators can be divided between two types according to construction of receptacle: monolithic type and bonded type. In a monolithic-type crystal oscillator, a receptacle is employed in which are formed as a monolithic unit: a crystal unit housing which houses the crystal unit, and an element housing which houses circuit elements in which components such as an oscillation circuit are formed. In a bonded-type crystal oscillator, on the other hand, a first receptacle portion which includes a crystal unit housing and a second receptacle portion which includes an element housing are formed separately and then bonded together to construct the crystal oscillator.

FIGS. 1A and 1B show the construction of monolithic-type surface-mount crystal oscillators.

In the crystal oscillator shown in FIG. 1A, concavities are formed in both principal surfaces of the receptacle body made of, for example, laminated ceramic, the concavity on one of the principal surfaces being crystal unit housing 1 for housing the crystal unit. Quartz crystal blank 3 which constitutes the crystal unit is contained in crystal unit housing 1 with one end of crystal blank 3 secured by conductive adhesive 4 to the bottom surface of the concavity of crystal unit housing 1. Planar cover 5 is placed so as to cover the concavity and hermetically seal crystal blank 3 inside the concavity. An approximately rectangular concavity which is formed on the other principal surface of the receptacle main body constitutes element housing 2. In element housing 2, approximately rectangular IC chip 6 incorporating components such as an oscillation circuit is secured to the bottom surface of the concavity. In addition, mounting electrodes 9, which are provided for establishing electrical connections when this surface-mount crystal oscillator is mounted on an external wiring board, are provided on areas corresponding to the periphery of the concavity of element housing 2. IC chip 6 and crystal blank 3 are electrically connected by conduction paths (not shown in the figure) which are formed inside the receptacle main body, and further, IC chip 6 and mounting electrodes 9 are also electrically connected by conduction paths which are formed inside the receptacle main body or by circuit patterns which are formed on the surface of the receptacle main body.

The crystal oscillator shown in FIG. 1B is substantially identical to the oscillator shown in FIG. 1A, but differs from the oscillator shown in FIG. 1A in that the concavity for crystal unit housing 1 is not formed on the principal surface of the receptacle main body. Instead, crystal blank 3 is sealed by means of cover 5, in which a concavity of a size which can accommodate crystal blank 3 is formed.

FIGS. 2A and 2B show the construction of bonded-type surface-mount crystal oscillators.

The bonded-type surface-mount crystal oscillator involves first preparing crystal unit 1A in the form of a crystal unit housing in which crystal blank 3 has been sealed, and package substrate 2A having a concavity, IC chip 6 being secured to the bottom surface of this concavity. Package substrate 2A is made of, for example, laminated ceramic. Electrodes 7 which include a pair of terminals used for electrical connection to crystal blank 3 are formed at the four corners of crystal unit 1A. Electrodes 7 are electrically connected to crystal blank 3 by means of a conductive path (not shown in the figure) which passes through the base wall of crystal unit 1A and a circuit pattern which is formed on, for example, the surfaces of the concavity. Joining electrodes 8 are formed on package substrate 2A at positions which correspond to electrodes 7 of crystal unit 1A. The two components, that is, crystal unit 1A and package substrate 2A, are unified by joining electrodes 7 of crystal unit 1A to joining electrodes 8 of package substrate 2A, thereby completing the surface-mount crystal oscillator. At this time, crystal unit 1A may be bonded to the principal surface of package substrate 2A in which the concavity has not been formed, as shown in FIG. 2A, or may be bonded so as to cover the concavity on package substrate 2A as shown in FIG. 2B. These bonded-type surface-mount crystal oscillators are further provided with mounting electrodes 9, which are used to establish electrical connections when the surface-mount crystal oscillator is mounted on an external wiring board, at positions which will be on the outside surface after bonding. Both joining electrodes 8 and mounting electrodes 9 also electrically connect with IC chip 6 by way of the circuit pattern or conductive paths not shown in the figure.

In either of the above-described surface-mount crystal oscillators, IC chip 6 is secured to the bottom surface of the concavity of the element housing by means of, for example, face-down bonding which is realized by ultrasonic thermo-compression bonding using bumps 10. Large-capacitance capacitors 11 which are difficult to integrate in IC chip 6 are loaded together with IC chip 6 on the bottom surface of the concavity of the element housing. In these surface-mount crystal oscillators, moreover, protective resin layer 12 is typically provided on the bottom surface of the concavity of the element housing as generally shown in FIG. 3 to protect the surface layer of IC chip 6 which has exposed terminals. The surface layer of IC chip 6 in this case is a layer which is formed on, of the two principal surfaces of the IC chip, the principal surface which electrically connects to the bottom surface of the element housing in face-down bonding. In particular, when face-down bonding is implemented by using bumps, a gap may occur between the surface layer and the bottom surface of the concavity, and the surface layer therefore tends to come in contact with the outer atmosphere by way of this gap.

Protective resin layer 12 is formed by injecting fluid resin from a nozzle onto the bottom surface of the concavity of the element housing following face-down bonding of IC chip 6, whereby this fluid resin penetrates from the bottom surface side of IC chip 6, following which the resin layer is cured. In this case, protective resin layer 12 preferably covers the entire surface layer of IC chip 6, but as a minimum, protective resin layer 12 must be applied along the outer periphery of IC chip 6 to isolate the surface layer from the outer atmosphere.

With the progress toward greater compactness or miniaturization of surface-mount crystal oscillators in recent years, crystal oscillators having planar outer dimensions measuring, for example, 4 mm×2.5 mm have been developed. In such cases, accommodating both IC chip 6 and large-capacitance capacitors 11 in the element housing is problematic, and capacitors 11 are therefore no longer arranged inside the crystal oscillator but rather, provided by attachment to the external wiring board on which the surface-mount crystal oscillator is mounted. Thus, as shown in FIG. 4, only IC chip 6 is accommodated in element housing 2 to guarantee space for loading IC chip 6.

Nevertheless, the external size of IC chip 6 in a crystal oscillator which has been miniaturized in this way is only slightly smaller than the dimensions of the bottom surface of the concavity of element housing 2. As a result, the gap between IC chip 6 and the inner walls of the concavity thus becomes smaller than the diameter, and particularly the inner diameter, of the nozzle which is used for injecting the fluid resin. Even when an injection needle is used as the nozzle, the inner diameter of the nozzle is on the order of 0.4 mm. In contrast, if the outer planar dimension of the crystal oscillator is 4 mm×2.5 mm, then the dimension of the bottom surface of the concavity will be approximately 2.3 mm×1.6 mm and the planar dimension of IC chip 6 will be approximately 1.9×1.3 mm. If IC chip 6 is secured to the bottom surface of the concavity without any inclination to one side, the gap between the IC chip 6 and the side walls of the concavity will be a maximum of approximately 0.2 mm.

As illustrated in FIG. 5, when the gap between IC chip 6 and the inner walls of the concavity is this narrow, the surface tension and viscosity of fluid resin 12A will impede penetration of fluid resin 12A despite injection of fluid resin 12A from this gap by nozzle 13, and in some cases, an adequate amount of fluid resin 12A will not reach the bottom surface of the concavity. If fluid resin does not penetrate as far as the bottom surface of the concavity, the surface layer of IC chip 6 will come into contact with the outer atmosphere, and this contact will lead to damage to the IC chip due to the humidity content in the atmosphere. This problem can be solved by reducing the size of the IC chip, but in the current state of the art, the above-described outer dimensions must be maintained to guarantee the functionality of the oscillation circuit or the like. Another possible solution would involve reducing the width of the frame portion which is formed along the periphery of the concavity of the element housing to increase the size of the concavity without increasing the outer dimensions of the crystal oscillator, but if the maintenance of mechanical strength or the formation of the mounting electrodes and joining electrodes on this frame portion are taken into consideration, a uniform reduction of the width of the frame portion becomes problematic.

SUMMARY OF THE INVENTION

It is an object of the present invention to provide a surface-mount crystal oscillator which allows miniaturization while allowing adequate protection of an IC chip.

The object of the present invention is achieved by means of a surface-mount crystal oscillator which includes a crystal unit housing in which a crystal blank is accommodated and hermetically sealed; and an element housing which is provided on the bottom-surface side of the crystal unit housing, in which a concavity having an open face is formed, and in which an IC chip is secured to the bottom surface of the concavity; wherein a notch portion which is adjoining and connecting to the concavity and which is used for injecting fluid resin is formed in the frame portion of the periphery of the concavity; and wherein a protective resin layer of the IC chip is formed by injecting the fluid resin onto the bottom surface of the concavity by way of the notch portion.

In the present invention, a portion of the side walls of the concavity of the element housing is notched to serve as conduits for injecting fluid resin, thereby facilitating the injection of the fluid resin. As a result, a protective resin layer for protecting the IC chip can be reliably formed, and the IC chip can therefore be reliably protected despite further size reduction and miniaturization of a surface-mount crystal oscillator.

DETAILED DESCRIPTION OF THE INVENTION

Figure 5:
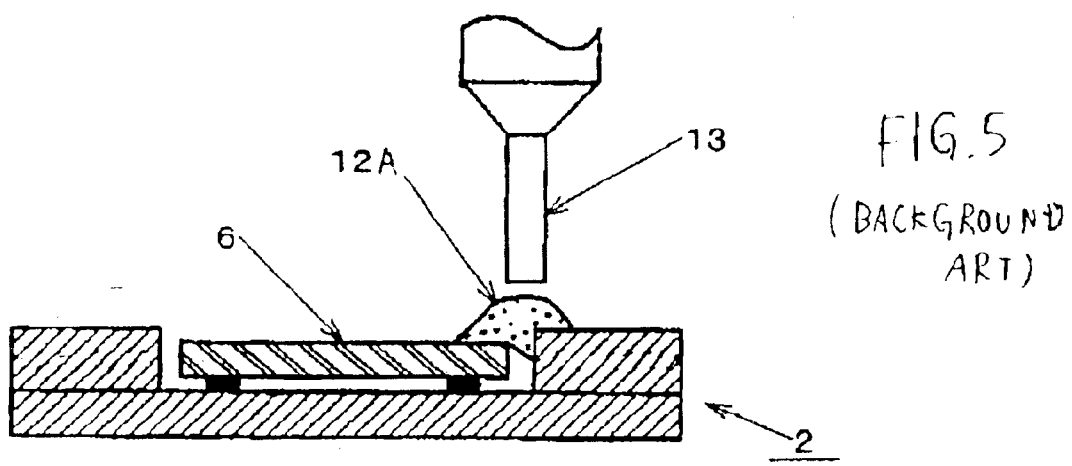
FIG. 5 is a sectional view illustrating injection of fluid resin into the element housing of the surface-mount crystal oscillator of the prior art.

In FIG. 5 which shows a surface-mount crystal oscillator according to an embodiment of the present invention, constituent elements which are identical to elements shown in FIGS. 1A, 1B, 2A, 2B, 3 and 4 are identified by the same reference numerals, and redundant explanation is omitted.

Figures 2A, 2B:
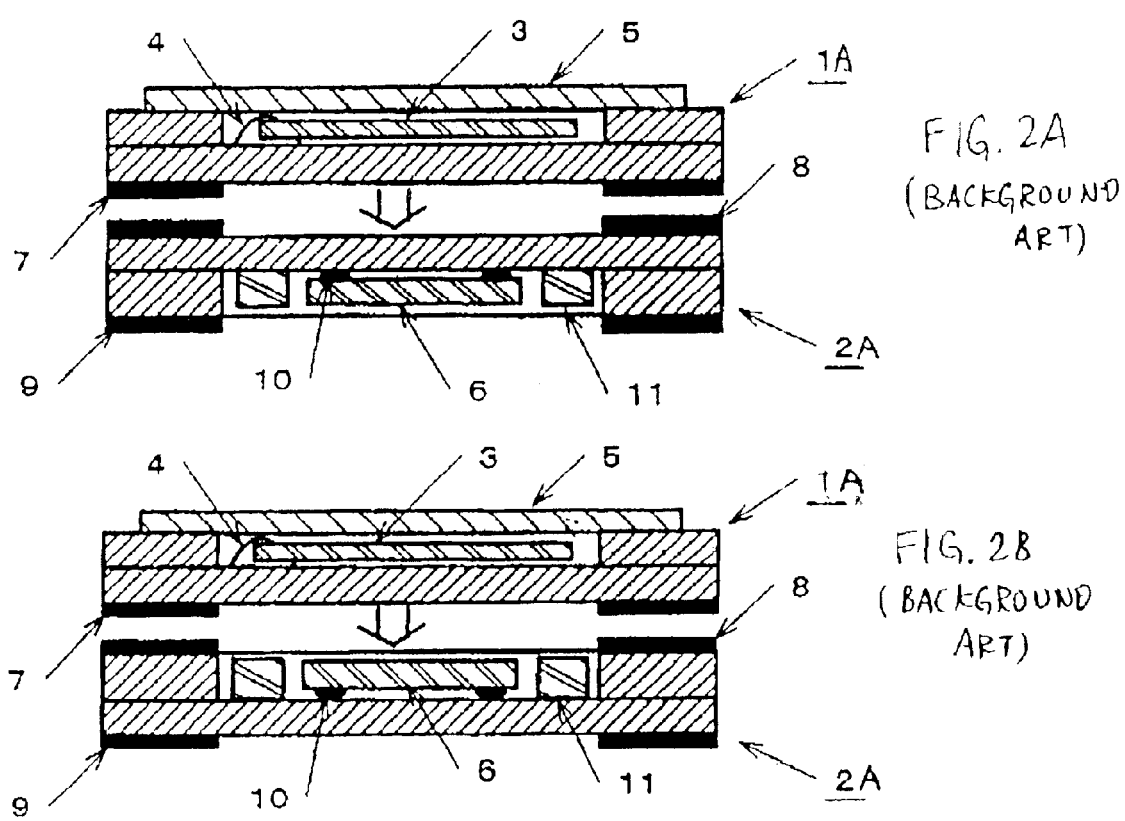
FIGS. 2A and 2B are exploded sectional views each showing the construction of a bonded-type surface-mount crystal oscillator of the prior art.
Figure 3:
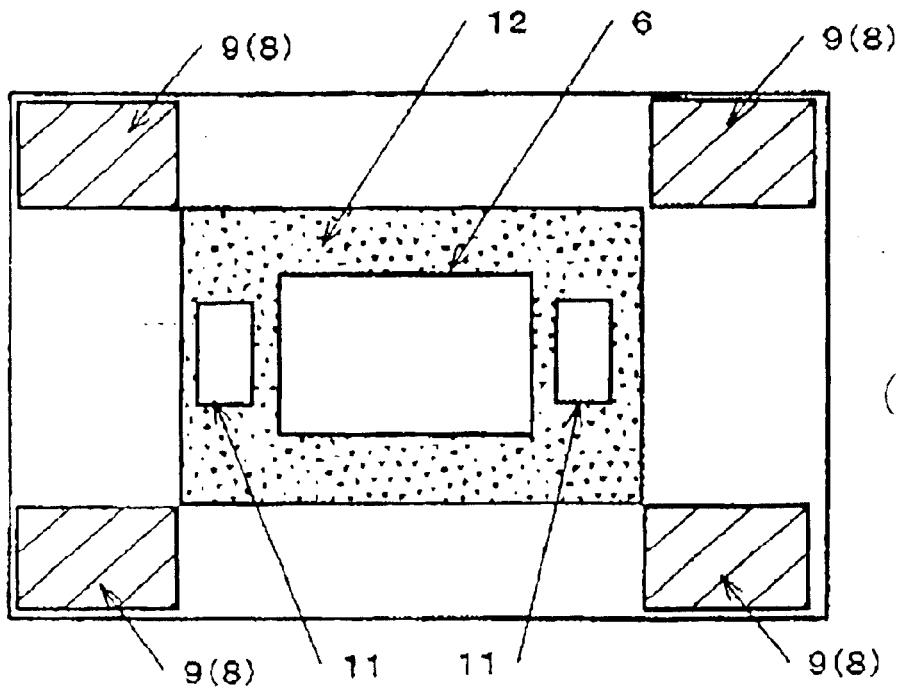
FIG. 3 is a plan view showing the element housing of a surface-mount crystal oscillator of the prior art.
Figure 4:
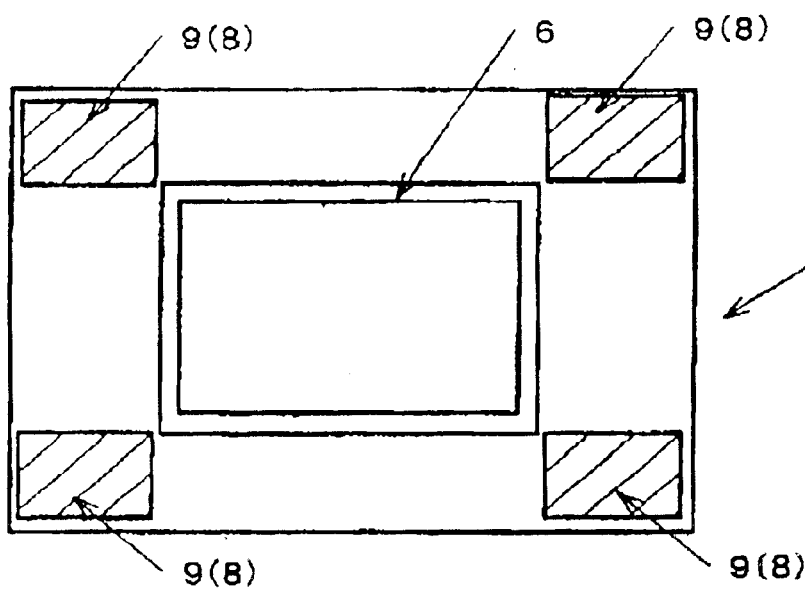
FIG. 4 is a plan view showing the element housing of another surface-mount crystal oscillator of the prior art.

As with the crystal oscillator shown in FIGS. 1A, 1B, 2A, and 2B, the surface-mount crystal oscillator of the present embodiment is provided with crystal unit housing 1 and element housing 2. The crystal oscillator of the present embodiment may be a monolithic-type device in which a crystal unit housing and element housing are formed as a single unit in a receptacle main body as with the device shown in FIGS. 1A and 1B, or may be a bonded-type device in which separately formed crystal unit housing and element housing are bonded together as shown in FIGS. 2A and 2B. In either case, in the crystal oscillator of the present embodiment, a generally rectangular concavity is formed in element housing 2 or in a package substrate which serves as an element housing, and notch portions 14 or recess portions for injecting fluid resin are provided in the frame portion of the periphery of this concavity. These notch portions 14 are connected to the concavity of element housing 2 and appear as portions scooped from the side walls of the frame portion.

When the crystal oscillator is of the monolithic-type, or when the crystal oscillator is of the bonded-type and the crystal unit is bonded to the surface in which the concavity of the package substrate is not formed, mounting electrodes 9 which are used for connecting to an external wiring board are formed at each of the four corners of the upper surface of the frame portion which surrounds the approximately rectangular concavity in element housing 2 (or package substrate). Notch portions 14 are formed in substantially the center of each of the pair of shorter sides of the four sides of the frame portion.

When the crystal oscillator is the bonded-type and the crystal unit is bonded so as to cover the concavity in the package substrate, joining electrodes 8 which are used for connecting with electrodes 7 of the crystal unit are formed at the four corners of the upper surface of the frame portion which surrounds the approximately rectangular concavity of element housing (i.e., package substrate) 2. In such a case, notch portions 14 are formed in substantially the center of each of the pair of shorter sides of the four sides of the frame portion.

In the present embodiment, the depth of notch portions 14 reaches the depth of the bottom surface of the concavity. In other words, notch portions 14 have a depth which is substantially equal to a depth of the concavity. Notch portions 14 need only be just large enough to allow injection of fluid resin onto the bottom surface of the concavity from the nozzle for injecting the fluid resin. More specifically, the size of notch portions 14 should be set such that the combined size of notch portion 14 and the gap between the IC chip and side walls of the concavity is larger than the inside diameter of the nozzle for injecting the fluid resin. In the illustrated case, the size of notch portions 14 is a size such that the nozzle for injecting the fluid resin can directly contact the bottom surface of the concavity without being impeded by IC chip 6. In the crystal oscillator which is shown here, notch portions 14 are in arc form as semicircles each having a radius of 0.35 mm from the side wall of the concavity toward the frame portion. The formation of arc-shaped notch portions 14 in substantially the centers of sides of the frame portion does not interfere with the formation of joining electrodes 8 and mounting electrodes 9.

Explanation next regards the process for securing IC chip 6 to element housing 2 in this crystal oscillator.

Figure 7:
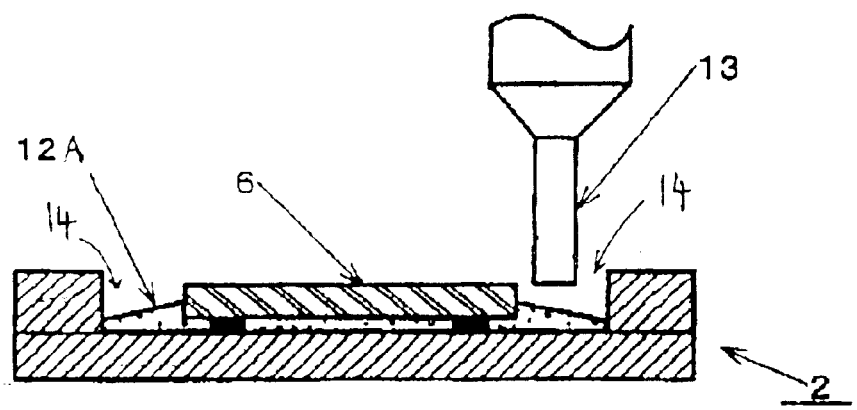
FIG. 7 is a sectional view illustrating injection of fluid resin into the element housing of the surface-mount crystal oscillator shown in FIG. 6.
Figure 8:
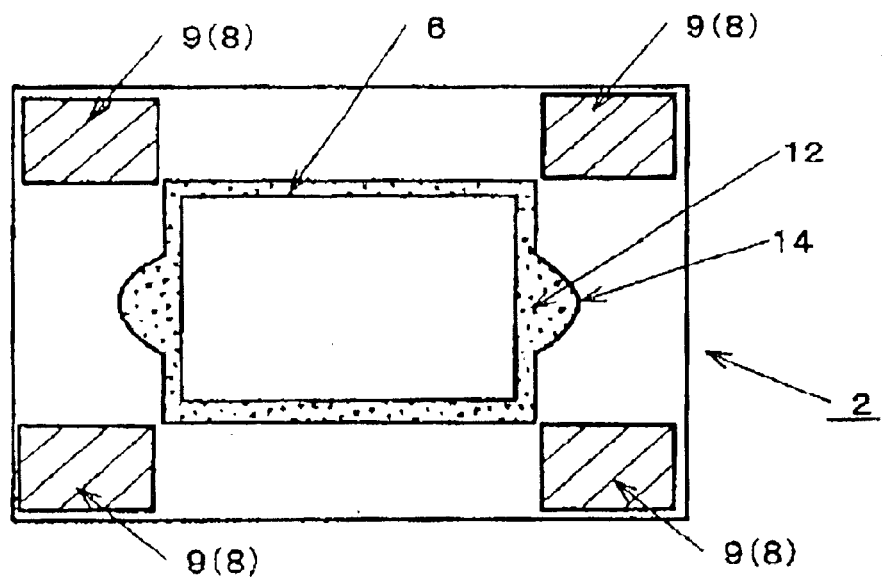
FIG. 8 is a plan view showing the element housing of the surface-mount crystal oscillator shown in FIG. 6 with an IC chip mounted therein.

An approximately rectangular concavity is formed beforehand in element housing 2 as previously described, and a pair of notch portions 14 are formed in the side walls of this concavity so as to connect with the concavity. Approximately rectangular IC chip 6 is then secured to the bottom surface of the concavity by means of face-down bonding, following which nozzle 13 for injecting fluid resin is used as shown in FIG. 7 to inject fluid resin 12A from notch portions 14 onto the bottom surface of the concavity. As a result, fluid resin 12A flows around the periphery of IC chip 6 under the liquid pressure during injection from both sides of the bottom surface of the concavity, and the fluid resin thus penetrates the gap between the bottom surface of the concavity and IC chip 6. As shown in FIG. 8, subsequent curing of the fluid resin results in the formation of protective resin layer 12 which surrounds at least the periphery of IC chip 6 and isolates the surface layer of IC chip 6 from the outer atmosphere.

When the crystal oscillator is the bonded-type in which the device is assembled by joining the crystal unit so as to cover the concavity in the package substrate, IC chip 6 is secured to the bottom surface of the concavity as described hereinabove and protective resin layer 12 is formed, following which the crystal unit is joined so as to cover the concavity.

The present embodiment thus not only enables reliable protection of IC chip 6 by means of protective resin layer 12, but also allows an acceleration of the miniaturization of surface-mount crystal oscillator. In particular, the advantage of the present invention increases as the planar dimensions of a crystal oscillator decreases from, for example, 4 mm×2.5 mm.

In the crystal oscillator described hereinabove, notch portions 14 are formed such that the depth of notch portions 14 reaches the depth of the bottom surface of the concavity. In this case, since the width of the frame portion which is formed along the periphery of the concavity of the element housing becomes small at the center region of the side of the frame portion, the crystal oscillator has possibility that satisfactory mechanical strength of the frame portion is not maintained.

Figure 9:
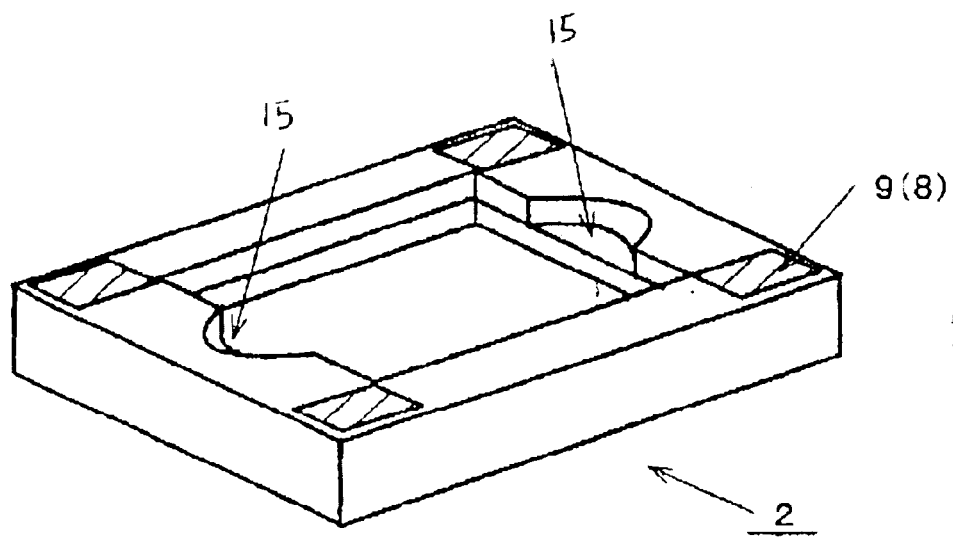
FIG. 9 is a perspective view for explaining a surface-mount crystal oscillator according to another embodiment of the present invention.

In the crystal oscillator shown in FIG. 9, notch portions 15 are formed so that the notch portions 15 have steps, and the mechanical strength of the frame portion is thus maintained. More specifically, in element housing 2 which is made of, for example, laminated ceramic, the frame portion formed on the bottom wall has a two-layer structure having a first layer and second layer, and arc-shaped notch portions are formed at only the second layer which is disposed at the top surface side of the frame portion. The element housing having such notch portions are formed by laminating the first layer and the second layer on the bottom wall in this order and burning them.

Figure 10:
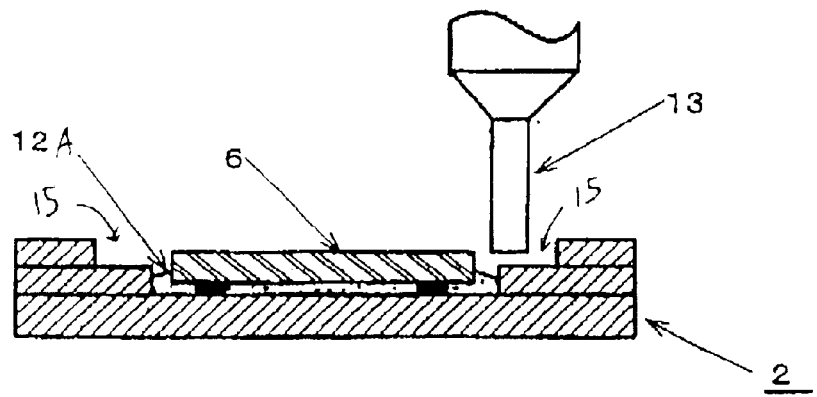
FIG. 10 is a sectional view illustrating injection of fluid resin into the element housing of the surface-mount crystal oscillator shown in FIG. 9.
Figure 1A:
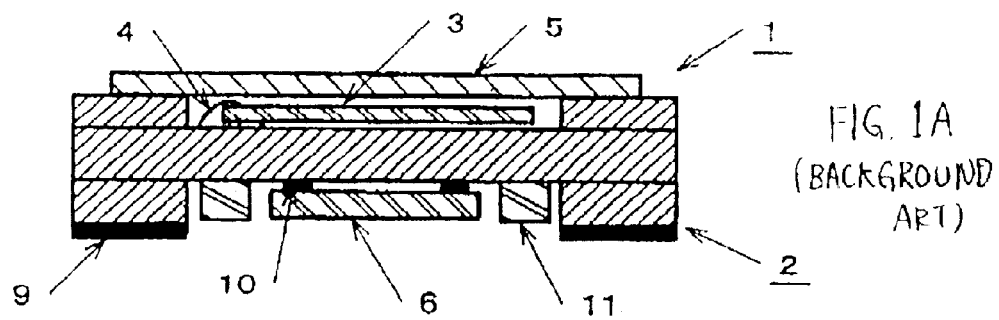
FIGS. 1A and 1B are sectional views each showing the construction of a monolithic-type surface-mount crystal oscillator of the prior art.
Figure 1B:
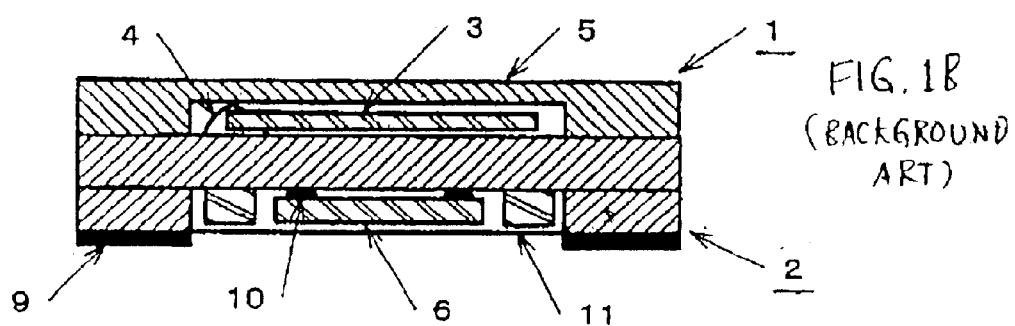
Figure 6:
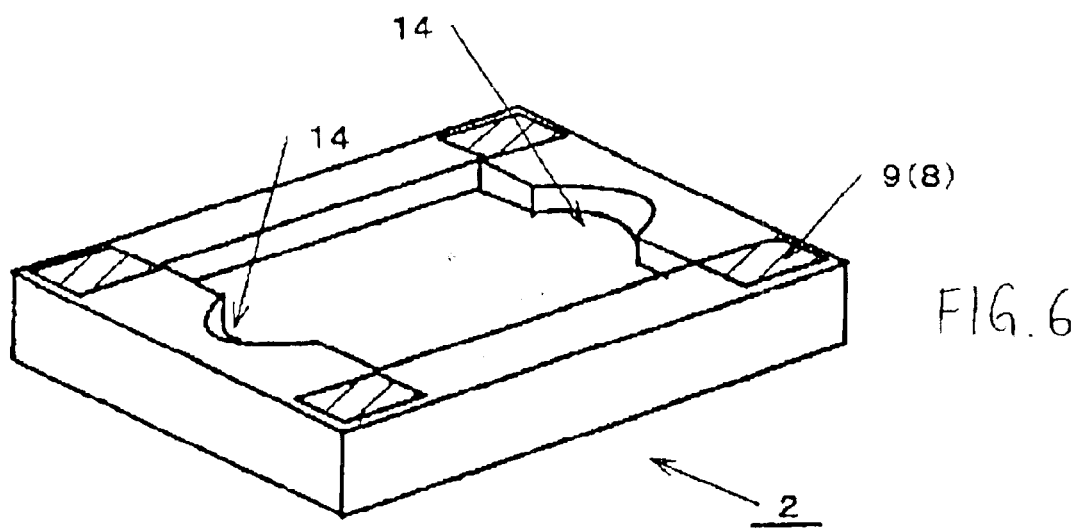
FIG. 6 is a perspective view for explaining a surface-mount crystal oscillator according to an embodiment of the present invention.

In the case that housing element 2 having notch portions 15 in which steps are formed is used, IC chip 6 is secured in the concavity and fluid resin is injected from notch portions 15 onto the bottom surface of concavity of element housing 2 at the same manner as the crystal oscillator shown in FIG. 6. The relationship between the size of nozzle used for injection of the fluid resin and the size of notch portions 15 is similar to that in the crystal oscillator shown in FIG. 6. The injection of fluid resin 12A from nozzle 13 to notch portion 15 is illustrated in FIG. 10.

In the embodiments described in the foregoing explanation, the notch portions for injecting fluid resin are provided in each of the two sides which are located at the ends in the longitudinal direction of the approximately rectangular concavity, but the notch portion may also be provided in only one side. Providing notch portions in both sides as described above ensures the flow of fluid resin around the periphery of IC chip 6. In addition, provision of the notch portions 13 is not limited to the two ends in the direction of length, and notch portions may be provided in the two longer sides if space allows. Further, although ultrasonic thermo-compression bonding using bumps was employed as the method for face-down bonding to secure the IC chip to the bottom surface of the concavity, the present invention can be similarly applied when another securing method is adopted. In other words, the present invention is amenable to a wide range of applications in which a protective resin layer is injected to isolate a surface layer from the outside, thereby protecting a surface layer on which terminals are provided on IC chip 6.

What is claimed is:

1. A surface-mount crystal oscillator, comprising:
   a crystal unit housing in which a crystal blank is accommodated and hermetically sealed;
   an element housing which is provided on a bottom surface-side of said crystal unit housing, a concavity being formed in said element housing and being constituted by a peripheral frame portion and a bottom surface, and an IC chip being secured to the bottom surface of said concavity, said frame portion having a top surface and inner sidewalls surrounding the IC chip;

wherein a notch portion for injecting fluid resin is formed from the top surface toward the bottom surface in a portion of the inner sidewalls of said concavity and faces sides of the IC chip; and a protective resin layer filling a gap between said secured IC chip and the bottom surface, said protective resin layer being formed from said fluid resin injected from said notch portion.

2. The crystal oscillator according to claim 1, wherein said notch portion has a depth which is substantially equal to a depth of said concavity.

3. The crystal oscillator according to claim 2, wherein said IC chip is secured by the bottom surface of said concavity by means of face-down bonding.

4. A surface-mount crystal oscillator comprising:

a crystal unit housing in which a crystal blank is accommodated and hermetically sealed; and an element housing which is provided on a bottom surface-side of said crystal unit housing, a concavity having an open face being formed in said element housing, and an IC chip being secured to a bottom surface of said concavity, wherein a notch portion which is adjoining and connecting to said concavity and which is used for injecting fluid resin is formed in a frame portion of a periphery of said concavity, wherein a protective resin layer of said IC chip is formed by injecting said fluid resin onto the bottom surface of said concavity by way of said notch portion, wherein said notch portion is provided by forming a step portion in said frame portion.

5. The crystal oscillator according to claim 4, wherein said frame portion has a two-layer structure having a first layer and second layer, said step portion is formed by forming a recess in said second layer which is arranged on said open face side of said frame portion.

6. The crystal oscillator according to claim 4, wherein said IC chip is secured by the bottom surface of said concavity by means of face-down bonding.

7. The crystal oscillator according to claim 1, wherein said crystal unit housing and said element housing are formed as a single unit.

8. The crystal oscillator according to claim 1, wherein said crystal unit housing and said element housing are connected by way of electrodes which are provided on an outer surface of said crystal unit housing and joining electrodes which are formed on an outer surface of said element housing.

9. A surface-mount crystal oscillator, comprising:

a crystal unit housing in which a crystal blank is accommodated and hermetically sealed; and an element housing which is provided on a bottom surface-side of said crystal unit housing, a concavity having an open face being formed in said element housing, and an IC chip being secured to a bottom surface of said concavity, wherein a notch portion which is adjoining and connecting to said concavity and which is used for injecting fluid resin is formed in a frame portion of a periphery of said concavity, wherein a protective resin layer of said IC chip is formed by injecting said fluid resin onto the bottom surface of said concavity by way of said notch portion, wherein said notch portion is shaped as a circular arc.

10. The crystal oscillator according to claim 1, wherein a planar shape of said concavity is approximately rectangular, and a planar shape of said IC chip is approximately rectangular.

11. A surface-mount crystal oscillator, comprising:

a crystal unit housing in which a crystal blank is accommodated and hermetically sealed; and an element housing which is provided on a bottom surface-side of said crystal unit housing; a concavity having an open face being formed in said element housing, and an IC chip being secured to a bottom surface of said concavity, wherein a notch portion which is adjoining and connecting to said concavity and which is used for injecting fluid resin is formed in a frame portion of a periphery of said concavity, wherein a protective resin layer of said IC chip is formed by injecting said fluid resin onto the bottom surface of said concavity by way of said notch portion, wherein said notch portion is formed in each of two opposing sides of said concavity.

12. The crystal oscillator according to claim 11, wherein said two opposing sides are two shorter sides of four sides of said concavity.

13. The crystal oscillator according to claim 11, wherein said notch portions are shaped as circular arcs.

14. The crystal oscillator according to claim 10, wherein mounting electrodes used for connecting to an external circuit are formed at each of four corners of said frame portion.

15. The crystal oscillator according to claim 1, wherein the notch portion has an arc-shape.

16. The crystal oscillator according to claim 1, wherein the notch portion is formed in two of the sidewalls facing each other.

17. The crystal oscillator according to claim 1, wherein solely the IC chip is placed in the cavity.

18. (new): The crystal oscillator according to claim 1, wherein the notch portion has a depth less than a thickness of the frame portion which is a distance between the top surface and the bottom surface.

19. The crystal oscillator according to claim 1, wherein the frame portion is rectangular and the sidewalls of the frame portion have four sidewalls, two of which are shorter than the other, wherein the notch portion is formed in each shorter sidewall.

20. The crystal oscillator according to claim 19, wherein the notch portion is formed in the middle in a length width direction of each shorter sidewall.

* * * * *